(12) United States Patent
Watson et al.

(10) Patent No.: US 7,728,751 B2
(45) Date of Patent: Jun. 1, 2010

(54) PIPELINED CONVERTER

(75) Inventors: Minh V. Watson, Fremont, CA (US); Tung Tran, San Jose, CA (US)

(73) Assignee: Toshiba America Electronics Components, Inc., Irvine, CA (US)

( * ) Notice: Subject to any disclaimer, the term of this patent is extended or adjusted under 35 U.S.C. 154(b) by 0 days.

(21) Appl. No.: 11/781,742

(22) Filed: Jul. 23, 2007

(65) Prior Publication Data
US 2008/0198058 A1   Aug. 21, 2008

Related U.S. Application Data

(60) Provisional application No. 60/890,365, filed on Feb. 16, 2007.

(51) Int. Cl.
*H03M 1/38* (2006.01)
(52) U.S. Cl. .................................. 341/161; 341/155
(58) Field of Classification Search ................. 341/161, 341/162, 155; 375/354
See application file for complete search history.

(56) References Cited

U.S. PATENT DOCUMENTS

| | | | |
|---|---|---|---|
| 5,170,075 A | 12/1992 | de Wit | |
| 5,838,200 A | 11/1998 | Opris | |
| 5,847,601 A | 12/1998 | Wang | |
| 6,124,819 A * | 9/2000 | Zhou et al. | 341/155 |
| 6,195,032 B1 | 2/2001 | Watson et al. | |
| 6,348,888 B1 | 2/2002 | Yu | |
| 6,700,523 B2 * | 3/2004 | Konno | 341/161 |
| 6,710,735 B1 | 3/2004 | Lin | |
| 6,933,876 B1 * | 8/2005 | Underbrink et al. | 341/162 |
| 7,016,695 B1 * | 3/2006 | Bahai | 455/466 |
| 7,034,737 B1 | 4/2006 | Huang | |
| 7,451,334 B2 * | 11/2008 | Chen et al. | 713/323 |
| 2002/0003486 A1 | 1/2002 | Watson | |
| 2006/9165198 | 7/2006 | Tietjen | |
| 2007/0176814 A1 * | 8/2007 | Grace | 341/155 |
| 2007/0223633 A1 * | 9/2007 | Garrity et al. | 375/354 |

OTHER PUBLICATIONS

Abo, et al., A 1.5-V. 10-bit, 14.3-MS/s CMOS Pipeline Anolog-to-Digital Converter, IEEE Journal of Solid-State Circuits, vol. 34, No. 5, May 1999, pp. 599.

Gupta, et al., A 64-MHz Clock-Rate ADC With 88-dB SNDR and—105-dB IM3 Distortion at a 1.5-MHz Signal Frequency, IEEE Journal of Solid-State Circuits, vol. 37, No. 12, Dec. 2002, pp. 1653-1661.

\* cited by examiner

*Primary Examiner*—Jean B Jeanglaude
*Assistant Examiner*—Joseph Lauture
(74) *Attorney, Agent, or Firm*—Tucker Ellis & West LLP

(57) ABSTRACT

The invention relates to an apparatus comprising a pipelined converter, such as a pipelined ADC. The pipelined converter has a first set of stages and a second set of stages. A clocking circuit is configured to generate a plurality of clocking signals for the pipelined converter. The plurality of clocking signals comprise a first clocking signal at a first voltage level that is provided to the first set of stages and a second clocking signal at a second voltage level that is provided to the second set of stages.

19 Claims, 4 Drawing Sheets

US 7,728,751 B2

PIPELINED CONVERTER

CROSS-REFERENCE TO RELATED APPLICATIONS

This application claims the benefit of priority of U.S. Provisional Application No. 60/890,365 filed Feb. 16, 2007.

BACKGROUND

This application is generally related to pipelined converters such as are used in pipelined analog to digital converters (ADCs).

Analog-to-digital converters are employed in a variety of electronic systems including computer modems, wireless telephones, satellite receivers, process control systems, etc. For such systems, it is desirable to employ cost-effective ADCs that efficiently convert an analog input signal to a digital output signal, over a wide range of frequencies and signal magnitudes, with minimal noise and distortion.

An ADC typically converts an analog signal to a digital signal by sampling the analog signal at pre-determined sampling intervals and generating a sequence of binary numbers via a quantizer. A resultant sequence of binary numbers is a digital representation of the sampled analog signal. Some commonly used types of ADCs include integrating ADCs, Flash ADCs, pipelined ADCs, successive approximation register ADCs, Delta-Sigma ADCs, two-step ADCs, etc. Pipelined ADCs and Delta-Sigma ADCs are currently popular in applications requiring higher resolutions.

A pipelined ADC circuit samples an analog input signal using a sample-and-hold circuit to hold the input signal steady and a first stage ADC to quantize the input signal. The first stage ADC then feeds the quantized signal to a digital-to-analog converter (DAC). The pipelined ADC circuit subtracts the output of the DAC from the analog input signal to produce a residue signal of the first stage. The residue signal is passed as the input to the next stage. A similar set of operations is performed in the subsequent stages of the ADC.

OVERVIEW OF EXAMPLE EMBODIMENTS

The following presents a simplified summary of the example embodiments in order to provide a basic understanding of some aspects of the example embodiments. This summary is not an extensive overview of the example embodiments. It is intended to neither identify key or critical elements of the invention nor delineate the scope of the invention. Its sole purpose is to present some concepts of the example embodiments in a simplified form as a prelude to the more detailed description that is presented later.

In accordance with an example embodiment, there is disclosed herein, an apparatus comprising a pipelined converter such as a pipelined ADC. The pipelined converter has a first set of stages and a second set of stages. A clocking circuit is configured to generate a plurality of clocking signals for the pipelined converter. The plurality of clocking signals comprise a first clocking signal at a first voltage level that is provided to the first set of stages and a second clocking signal at a second voltage level that is provided to the second set of stages.

There is shown and described an example embodiment of this invention, simply by way of illustration of at least one of the best modes best suited to carry out the invention. As it will be realized, the invention is capable of other different embodiments and its several details are capable of modifications in various obvious aspects all without departing from the invention. Accordingly, the drawing and descriptions herein will be regarded as illustrative in nature and not as restrictive.

BRIEF DESCRIPTION OF THE DRAWINGS

The accompanying drawings incorporated herein and forming a part of the specification, illustrate examples of the present invention, and together with the description serve to explain the principles of the invention.

DESCRIPTION OF EXAMPLE EMBODIMENTS

Figure 1:
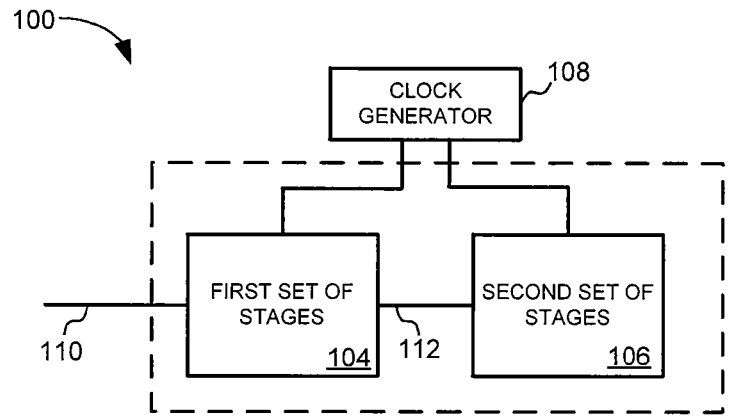
FIG. 1 illustrates an example of a block diagram of a pipelined converter having two sets of stages.

This description provides examples not intended to limit the scope of the invention, as claimed. The figures generally indicate the features of the examples, where it is understood and appreciated that like reference numerals are used to refer to like elements.

In an example embodiment that will be described herein, there is illustrated a pipelined converter configured to implement a twelve bit pipeline ADC. Each stage performs the same operation. Within each stage is a 1.5 bit analog to digital converter (ADC)/digital to analog converter (DAC) known as a multiplying DAC (or MDAC). The MDAC takes the input and processes the data with a 1.5 bit ADC. The result of the 1.5 bit ADC is then converted back to analog signal by a DAC and subtracted from the input. The result of the subtraction is multiplied by two and passes as residue to the next stage, except for the last stage. The residue voltage is equal to 2*(Vin−VDAC).

In an example embodiment, an additional clock signal with a higher voltage level is employed to drive a first set of stages. By using a higher voltage to drive the switches of the first set of stages (e.g. the first 3 stages at the input), it reduces distortion from sampling the switches within the stages. For example, the clock voltage for the first set of stages is sufficiently large to handle the input signal at the first stage while the clock voltage for the second set of stages if sufficient to handle the input signal into the second set of stages. In an example embodiment, the clocking signals are non-overlapping (e.g. one clock signal is on at a time). As will be described herein, employing a larger clocking voltage at the input stages can accommodate larger voltage swings at the input stages. For example, in some embodiments the first two stages of a pipeline ADC dominate the overall performance of the ADC. Using the higher voltage at the input stages to fully turn on the switches of the input stages can aid in achieving the desired resolution (e.g. 12 bit resolution).

A higher clocking voltage at the input stages enables a larger input to be applied to the input of the pipelined converter. The higher clocking voltage at the input stages also helps to reduce thermal noise that can degrade the performance of the pipelined converter.

FIG. 1 illustrates an example of a block diagram of a pipelined converter 100 having two sets of stages 104, 106. The first set of stages 104 comprises one or more stages of a pipelined converter, such as a pipelined ADC. The second set of stages 106, also comprises one or more stages of a pipelined converter, such as a pipelined ADC. In an example embodiment described herein, the pipelined converter is a 12 stage pipelined ADC, wherein the first three stages comprise the first set of stages 104 and the remaining nine stages comprise the second set of stages 106. Data is received by pipelined ADC via input 110. The residue from the first set of stages 104 is provided to the second set of stages 106 via connection 112.

Clock generator 108 provides clocking signals to the first set of stages 104 and the second set of stages 106. Clock generator 108 may have an input to receive an external clock signal from which two clocking signals are derived. Alternatively clock generator 108 may have internal oscillating circuit. In an example embodiment, clock generator 108 provides two clocking signals, one that is provided to the first set of stages 104 and the other to the second set of stages 106. Although the illustrated examples herein illustrate two clocking signals, those skilled in the art should readily appreciate that any physically realizable number of clocking signals may be provided by clock generator 108 to any physically realizable sets of stages. In an example embodiment, the clocking signals provided to the first set of stages 104 is at a first voltage level, and the clocking signals provided to the second set of stages 106 is at a second voltage level. In an example embodiment, the voltage provided to the first set of stages 104 is higher (e.g. 2.5V) than the voltage provided to the second set of stages (e.g. 1.5V).

In an example embodiment, the clocking signals produced by clock generator 108 are non-overlapping. For example, for a 12 stage pipelined ADC, twelve non-overlapping clocking signals may be provided. The clock signals to the first set of stages 104 (e.g. the first 1,2 or 3 stages of the pipelined ADC) are at the first voltage level whereas the clocking signals to the remaining stages (second set of stages 106) of the ADC are at the second voltage level.

In an example embodiment, each of the first set of stages and each of the second set of stages comprises a multiplying ADC (MADC). The MADC comprises a sample and hold circuit configured to receive an input for the stage (e.g. the first stage receives the signal; every other stage after the first stage receives the residue from the preceding stage). An m-bit analog to digital converter (ADC) is coupled to the sample and hold circuit and an m-bit digital to analog converter (DAC) is coupled to the ADC. A summing circuit receives a first input from the sample and hold circuit and a second input from the DAC. The summing circuit is configured to subtract the DAC input from the sample and hold input. An amplifier coupled to the summing circuit, the amplifier configured to have a gain of m, wherein m is an integer greater than 0. The output of the amplifier is the residue for the next stage. The output of each stage is acquired between the m-bit ADC and the m-bit DAC. In an example embodiment, m=1. A detailed description of the MDAC is provided in FIGS. 3 and 4. In an example embodiment, the input for the pipelined converter is received by the first stage of the first set of stages 104.

As will be described herein, for a pipelined ADC, the largest signal swings, which increase the possibility of distortion, occur at the input (first set of) stages 104. For example, the first stage receives the input signal and thus has the largest signal swing because the summing circuit subtracts the signal converted by the m-bit ADC/DAC from the original signal acquired at the sample and hold circuit. Thus, in an example embodiment the first set of stages 104 receive higher voltage clock signals to accommodate higher voltage swings. After the first set of stages (which may comprise, 1, 2, 3 or any number of stages desired for accommodating large input voltage signal swings), the remaining set (or sets) of stages may have lower voltage clocking signals because the input signals at each stage have lower voltage swings.

Figure 2:
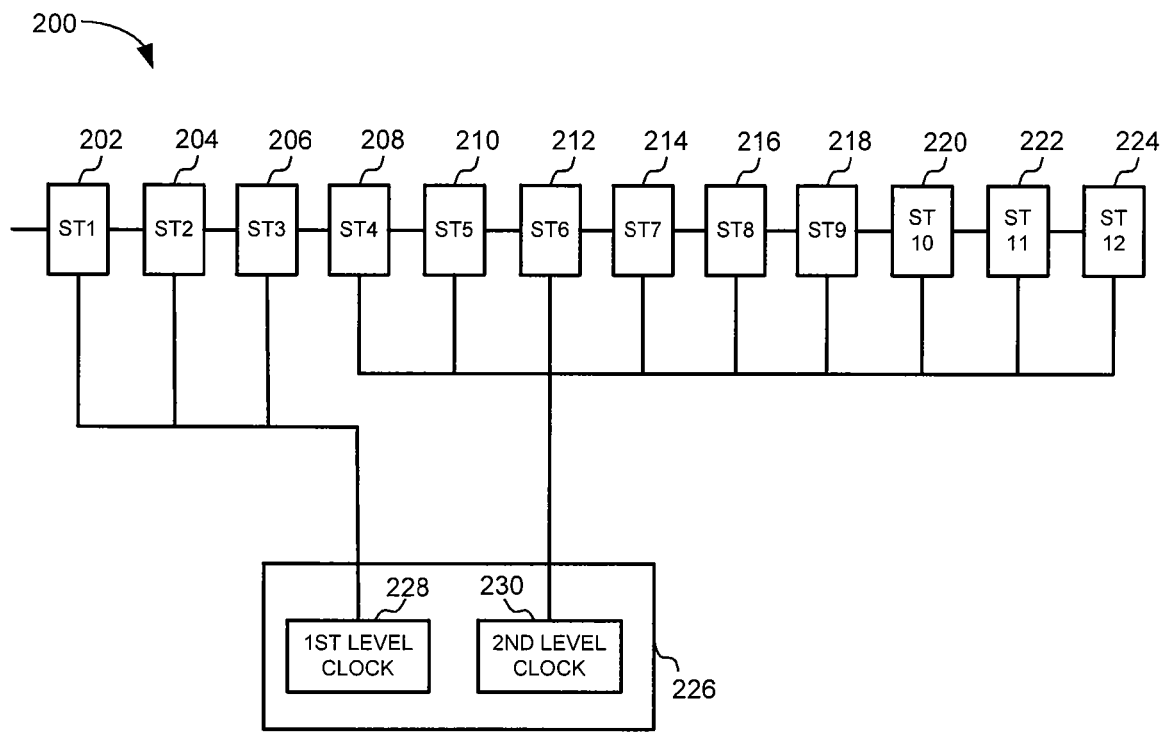
FIG. 2 illustrates an example of a twelve stage pipelined converter.

FIG. 2 illustrates an example of a twelve stage pipelined converter 200. Stages 202, 204, 206 form the first set of stages of pipelined converter 200. Stages 208, 210, 212, 214, 216, 218, 220, 222, 224 form the second set of stages.

Clock 226 provides the clocking signals for pipelined converter 200. As illustrated, clock signals having a first voltage level are provided by clock 228. Clocking signals from clock 228 are provided to the first set of stages, stages 202, 204, 206.

Clock signals having a second voltage level are provided by clock 230. Clock 230 provides clocking signals to the second set of stages, stages 208, 210, 212, 214, 216, 218, 220, 222, 224.

In an example embodiment, the clocking signals from clock 228 are at a higher voltage level (e.g. 2.5V) than the voltage level of the clocking signals from clock 230 (e.g. 1.5V). The twelve stage pipelined converter 200 is suitably adapted to implement a 12 stage pipelined ADC. In the example embodiment of FIG. 2, the input is received by stage 202. Stages 202, 204, 206 are clocked at a higher voltage level than stages 208, 210, 212, 214, 216, 218, 220, 222, 224, enabling the pipelined ADC to accommodate a higher voltage swing at the input to stage 202. Because the residue voltage at each stage decreases, after a certain number of input stages (3 in this example), lower powered stages employing lower voltage clock signals can be employed. In an example embodiment, the clocking signals from clock 226 are non-overlapping.

Figure 3:
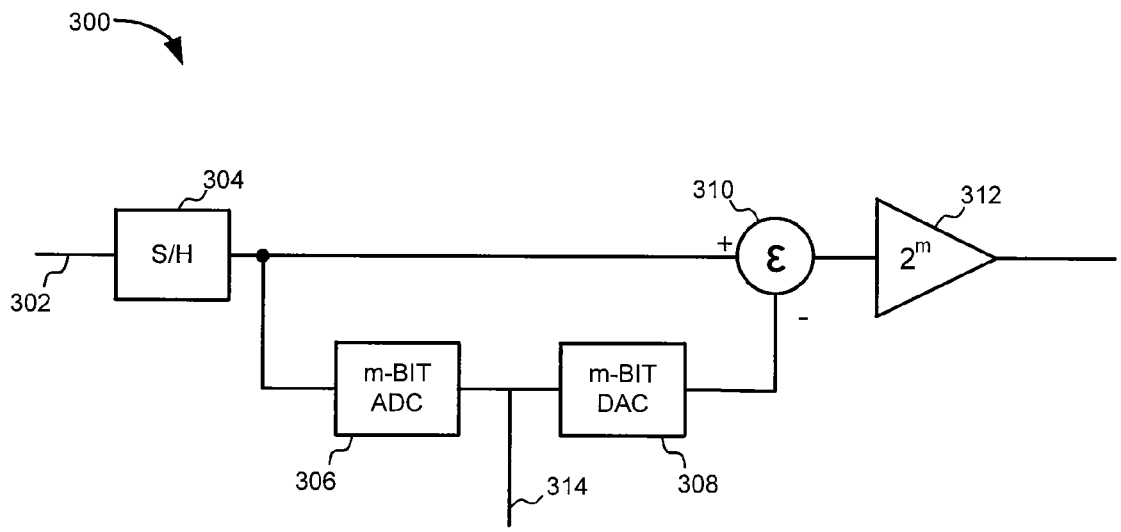
FIG. 3 illustrates a detailed example of a stage suitable for the pipelined converter to function as a pipelined ADC.

FIG. 3 illustrates a detailed example of a stage 300 suitable for the pipelined converter, such as pipelined converter 200 (FIG. 2) or pipelined converter 100 (FIG. 1) to function as a pipelined ADC. An input signal 302 is provided to sample and hold (S/H) circuit 304. Sample and hold circuit 304 samples a voltage at a selected time and holds (maintains) the voltage at the sampled level. The sampled voltage is provided to an m-bit ADC, where m is an integer greater than 0. The output for the stage can be acquired at output 314. The digital signal from the output of ADC 306 is provided to an m-bit Digital to Analog converter (DAC) 308, where m is the same value as m for ADC 306. DAC 308 converts the digital signal back to the analog domain.

Summer 310 is provided with the signal from sample and hold circuit 304 and DAC 308. Summer 310 subtracts the signal from DAC 308 from the signal from sample and hold circuit 308. The output of summer 310 is amplified by amplifier 312. The gain of amplifier 312 is set to the number of bits of resolution (m) of ADC 306. The output of amplifier 312 is the residue of the stage.

In an example embodiment, m=1. Thus, each stage resolves 1 bit and passes the residue to the next stage. In an example embodiment, the pipelined converter is a 12 bit pipelined ADC, where m=1 for each stage. The input stages of the 12 bit pipelined receive a clock signal having a larger voltage level than the clock levels of the remaining stages. For example, the first set of stages is the first three stages which receive a 2.5 volt clock signal, while remaining nine stages (the second set of stages) receive a 1.5 volt clock signal. Other embodiments may employ any number of stages for the first set (e.g. 1, or 2 stages, or 1<n−1 stages, where n=the number of stages of the pipelined converter).

Figure 4:
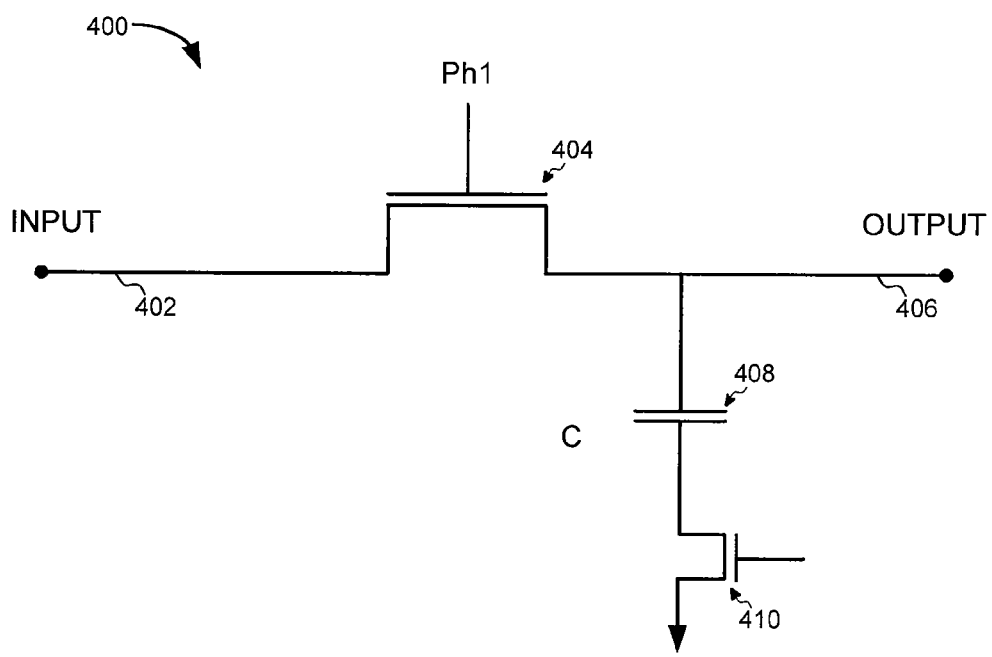
FIG. 4 illustrates an example of a sample and hold circuit for a pipelined converter, such as the example stage illustrated in FIG. 3.

FIG. 4 illustrates an example of a sample and hold circuit 400 for a pipelined converter. For example, circuit 400 is suitable to function as sample and hold circuit 304 illustrated in FIG. 3.

Sample and hold circuit 400 comprises an input 402 coupled to transmission gate 404. When transmission gate 404 is conducting, current can flow from input 402 to charge capacitor 408. Transmission gate 410 is not conducting while capacitor 408 is charging. After the signal has been 'sampled', transmission gate 404 turns off, enabling the voltage to be read at output node 406, which is between transmission gate 404 and capacitor 408. Transmission gate 410 switches to a conducting mode to discharge capacitor 408

In an example embodiment, larger transmission gates 404, 410 are employed for stages near the input of the pipelined converter than are used for stages farther away from the input. In addition, the input stages using the larger transmission gates 404, 410 receive a clock signal with a higher voltage level. Using a higher voltage to drive the switches of the first set of stages (e.g. the first 3 stages at the input of a pipelined ADC), can reduce distortion during sampling. Employing larger transistors at the input stage can improve electro-static discharge (ESD) performance.

As one skilled in the art can appreciate, if the voltage switching transmission gates 404, 410 is too low, the signal sampled on capacitor 408 will be inaccurate, creating distortion. Employing a higher clocking voltage at the input stage of a pipelined converter enables a larger input to applied without distortion. In addition, higher clocking voltage at the input stages also help to reduce thermal noise that can degrade the performance of the pipelined converter.

Figure 5:
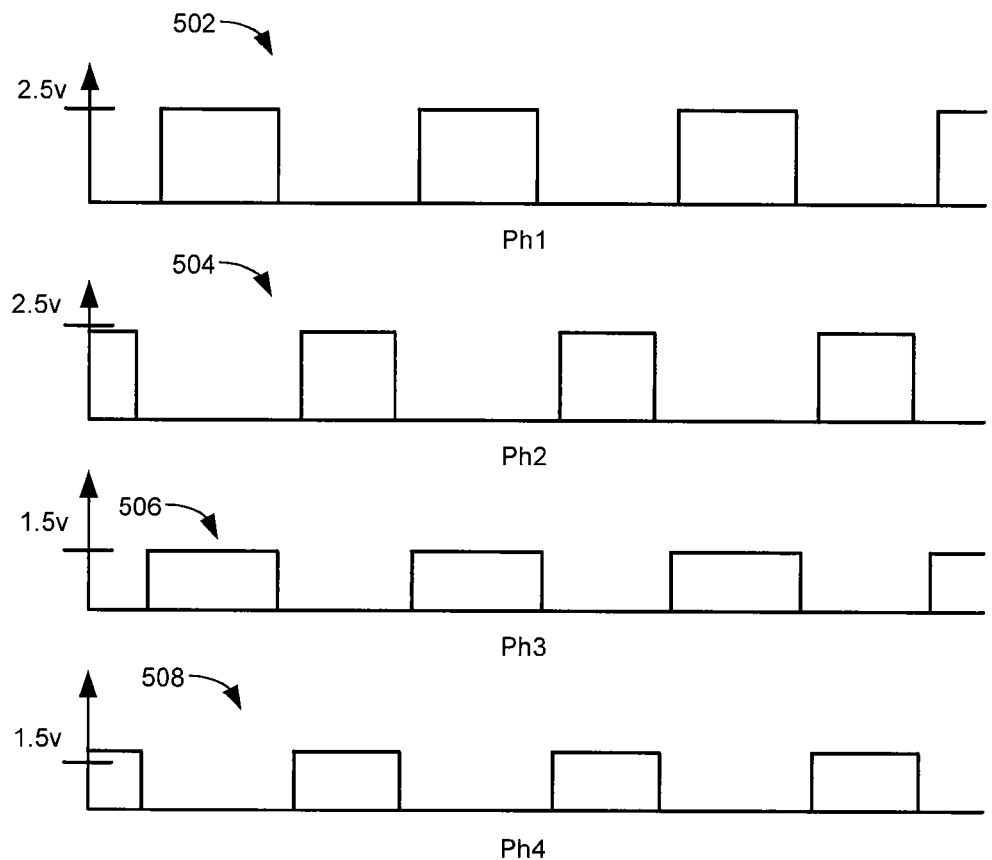
FIG. 5 illustrates an example of four phase non-overlapping clocking signals.

FIG. 5 illustrates an example of four phase non-overlapping clocking signals. The first phase 502 and second phase 504 are clocking signals at a first voltage level (e.g. 2.5 volts). The third phase 506 and fourth phase 508 are at a second voltage level (e.g. 1.5 volts). The four phases 502, 504, 506, 508 are non-overlapping.

As those skilled in the art can readily appreciate, the number of phases can be any physical realizable number. In an example embodiment employing twelve phases, four of the phases can be at the higher (e.g. 2.5 volt) level, while the remaining eight phases are at a lower (e.g. 1.5 volt) level.

Figure 6:
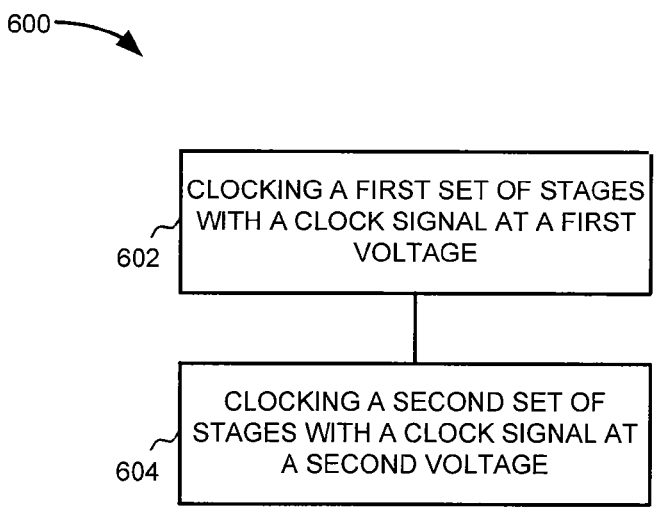
FIG. 6 illustrates an example methodology of a pipelined converter employing multi-level clocking signals.
Figure 7:
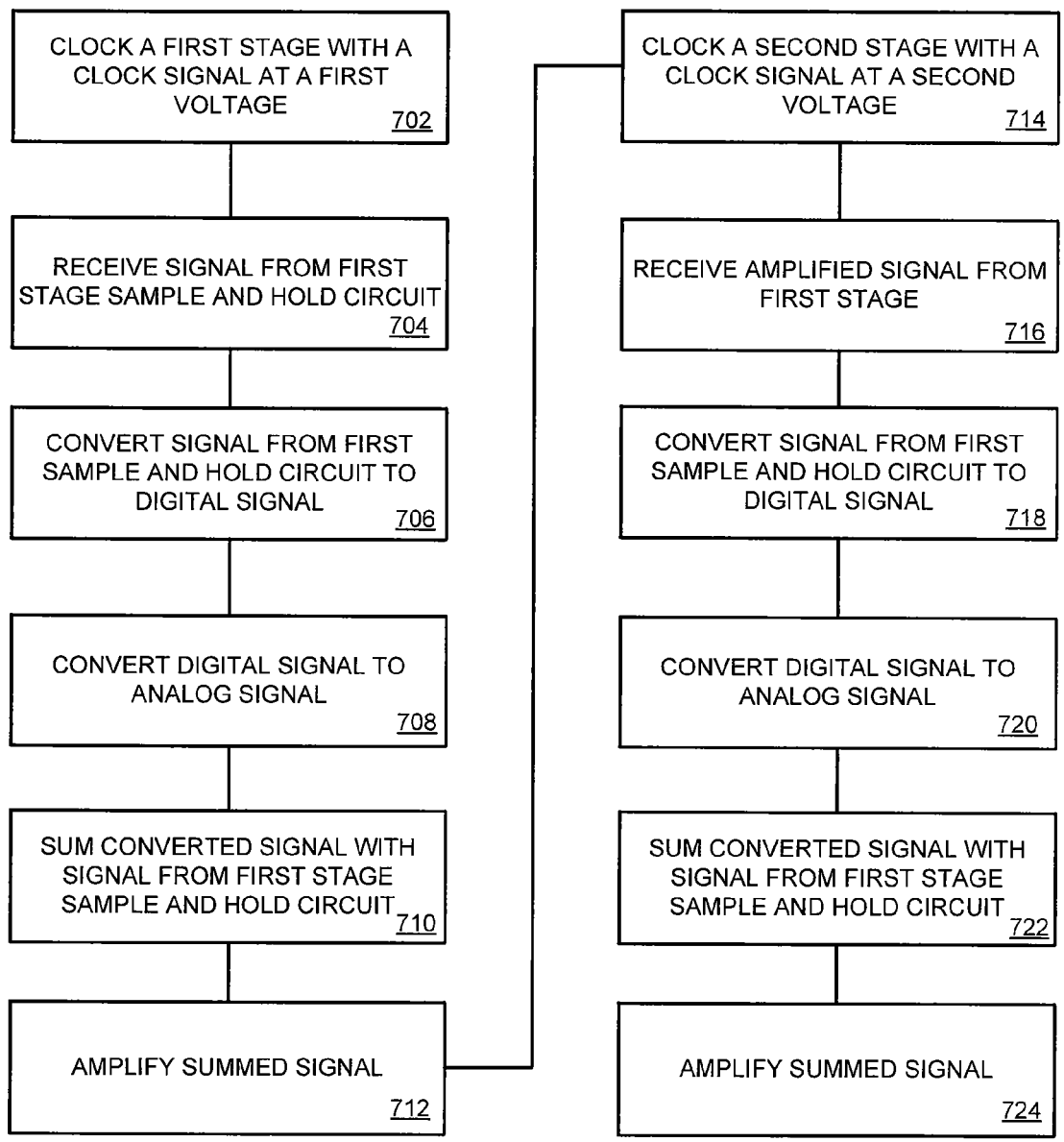
FIG. 7 illustrates a detailed example methodology of a pipelined converter employing multi-level clocking signals.

In view of the foregoing structural and functional features described above, methodologies in accordance with the example embodiment will be better appreciated with reference to FIGS. 6 and 7. While, for purposes of simplicity of explanation, the methodologies of FIGS. 6 and 7 are shown and described as executing serially, it is to be understood and appreciated that the example embodiment is not limited by the illustrated order, as some aspects could occur in different orders and/or concurrently with other aspects from that shown and described herein. Moreover, not all illustrated features may be required to implement a methodology in accordance with an aspect the example embodiment.

Referring to FIG. 6, there is illustrated a methodology 600 in accordance with an example embodiment. At 602, a first set of stages of a pipelined converter is clocked with a clock signal at a first voltage level. The first set of stages may comprise one or more stages. In an example embodiment, the first set of stages receives the input to the pipelined converter.

At 604, a second set of stages of a pipelined converter is clocked with a clock signal at a second voltage level. The second set of stages may comprise one or more stages. In an example embodiment, the second set of stages receive the residue from the first set of stages.

In an example embodiment, the clocking signals are non-overlapping. The clocking signals provided to the first set of stages are higher (e.g. 2.5v) than the clocking signals provided to the second set of stages (e.g. 1.5v). Each stage of the pipelined converter is part of a pipelined ADC. Each stage receives an input that is held by a sample and hold circuit. An ADC converts the input to a digital signal. The output for the stage is acquired at the output of the ADC. The output of the ADC is converted to an analog signal by a DAC. The output of the DAC is subtracted from the original signal from the sample and hold circuit by a summing circuit. The output of the summing circuit can be amplified and provided as residue to the next stage.

Referring to FIG. 7, there is illustrated a detailed methodology 700 in accordance with an example embodiment. At 702, a first stage is clocked by a clocking signal at a first voltage level. The first stage comprises a sample and hold circuit, an ADC, a DAC, a summer and an amplifier. As the clock signal is asserted, at 704 an input signal for the stage is received by a sample and hold circuit. An output of the sample and hold circuit is passed to an ADC. At 706, the ADC converts the signal from the sample and hold circuit to a digital signal. The output for the first stage can be acquired at the output of the ADC. The output of the ADC is passed to a DAC. At 708, the DAC converts the signal from the ADC to an analog signal. The output of the DAC is passed to a summing circuit. At 710, the summing circuit subtracts the output of the DAC from an output acquired from the sample and hold circuit. The output summer is passed to an amplifier. At 712, the output of the summer is amplified by the amplifier.

At 714, a second stage is clocked by a second clocking signal at a second voltage level.

The second stage comprises a sample and hold circuit, an ADC, a DAC, a summer and an amplifier. As the clock signal is asserted, at 716 an input signal for the second stage is received from the first stage by a sample and hold circuit. An output of the second stage sample and hold circuit is passed to the second stage ADC. At 718, the second stage ADC converts the signal from the second stage sample and hold circuit to a digital signal. The output for the second stage can be acquired at the output of the second stage ADC. The output of the second stage ADC is passed to the second stage DAC. At 720, the second stage DAC converts the signal from the second stage ADC to an analog signal. The output of the second stage DAC is passed to the second stage summing circuit. At 722, the second stage summing circuit subtracts the output of the second stage DAC from an output acquired from the second stage sample and hold circuit. The output summer is passed to the second stage amplifier. At 724, the output of the second stage summer is amplified by the second stage amplifier. If there are additional stages, the output of the amplifier is passed as residue to the next stage.

In an example embodiment, the clocking signals are non-overlapping. The clocking signals provided to the first of stage is higher (e.g. 2.5v) than the clocking signal provided to the second of stage (e.g. 1.5v).

What has been described above includes example implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. An apparatus, comprising:
   a pipelined converter comprising a first set of stages and a second set of stages; and
   a clocking circuit configured to generate a plurality of clocking signals;

wherein the plurality of clocking signals comprise a first clocking signal including first and second phases at a first amplitude that are provided to the first set of stages, and a second clocking signal including first and second phases at a second amplitude different than the first amplitude that are provided to the second set of stages;
wherein the first and second phases of the first clocking signal are non-overlapping;
wherein the first and second phases of the second clocking signal are non-overlapping;
wherein the first amplitude is greater than the second amplitude;
wherein the greater first amplitude corresponds to a higher voltage level so as to reduce sampling distortion; and
wherein a larger clocking voltage is employed at an input of the stages so as to accommodate larger voltage swings at the input stages.

2. An apparatus according to claim 1, wherein:
the first set of stages includes an input configured to receive data and the second set of stages is configured to receive an output of the first set of stages.

3. An apparatus according to claim 2, wherein the first amplitude is 2.5 volts and the second amplitude is 1.5 volts.

4. An apparatus according to claim 1, wherein the pipelined converter is a twelve stage analog to digital converter (ADC).

5. An apparatus according to claim 4, wherein the first set of stages is the first three stages of the ADC and the second set of stages is the remaining nine stages of the ADC.

6. An apparatus according to claim 5, wherein the clocking circuit generates twelve non-overlapping clocking signals.

7. An apparatus according to claim 6, wherein four of the twelve non-overlapping clocking signals are at the first amplitude provided to the first set of stages.

8. An apparatus according to claim 5, wherein each of the first set of stages and each of the second set of stages comprise:
a sample and hold circuit coupled configured to receive an input for the stage;
an m-bit analog to digital converter (ADC) coupled to the sample and hold circuit;
an m-bit digital to analog converter (DAC) coupled to the ADC;
a summing circuit receiving a first input from the sample and hold circuit and a second input from the DAC, the summing circuit configured to subtract the DAC input from the sample and hold input; and
an amplifier coupled to the summing circuit, the amplifier configured to have a gain of m;
wherein m is an integer greater than 0.

9. An apparatus according to claim 8, wherein m=1.

10. An apparatus according to claim 9, wherein the first amplitude is 2.5 volts and the second amplitude is 1.5 volts.

11. An apparatus according to claim 1, wherein each of the first set of stages and each of the second set of stages comprise:
a sample and hold circuit coupled configured to receive an input for the stage;
an m-bit analog to digital converter (ADC) coupled to the sample and hold circuit;
an m-bit digital to analog converter (DAC) coupled to the ADC;
a summing circuit receiving a first input from the sample and hold circuit and a second input from the DAC, the summing circuit configured to subtract the DAC input from the sample an hold input; and
an amplifier coupled to the summing circuit, the amplifier configured to have a gain of m;
wherein m is an integer greater than 0.

12. An apparatus according to claim 11, wherein m equals 1.

13. An apparatus according to claim 1, wherein the second set of stages comprises at least one stage after the first set of stages.

14. An apparatus according to claim 1, wherein the first set of stages includes two stages, and the second set of stages includes at least one stage after the first two stages.

15. An apparatus, comprising:
a pipelined converter comprising a first set of stages and a second set of stages; and
means for providing clocking signals to the pipelined converter;
wherein the means for providing clocking signals provides a first set of clocking signals including first and second phases at a first amplitude to the first set of stages, and a second set of clocking signals including first and second phases at a second amplitude different than the first amplitude to the second set of stages;
wherein the first and second phases of the first set of clocking signals are non-overlapping;
wherein the first and second phases of the second set of clocking signals are non-overlapping;
wherein the first amplitude is greater than the second amplitude;
wherein the greater first amplitude corresponds to a higher voltage level so as to reduce sampling distortion; and
wherein a larger clocking voltage is employed at an input of the stages so as to accommodate larger voltage swings at the input stages.

16. The apparatus according to claim 15, wherein:
the second set of stages of the pipelined converter is configured to receive an output from the first set of stages of the pipelined converter.

17. A method, comprising:
clocking a first set of stages of a pipelined converter with a first clocking signal including first and second phases at a first amplitude; and
clocking a second set of stages of the pipelined converter with a second clocking signal including first and second phases at a second amplitude different than the first amplitude;
wherein the first set of stages are input stages of the pipelined converter and the second set of stages are after the first set of stages;
wherein the first and second phases of the first clocking signal are non-overlapping;
wherein the first and second phases of the second clocking signal are non-overlapping;
wherein the first amplitude is greater than the second amplitude;
wherein the greater first amplitude corresponds to a higher voltage level so lo reduce sampling distortion; and
wherein a larger clocking voltage is employed at an input of the stages so as to accommodate larger voltage swings at the input stages.

18. A method according to claim 17, wherein the first set of clocking signals and the second set of clocking signals are non-overlapping.

19. The method according to claim 17, further including:
receiving by the second set of stages of the pipelined converter an output from the first set of stages of the pipelined converter.

* * * * *